United States Patent
Yoshie et al.

(10) Patent No.: US 6,924,176 B2
(45) Date of Patent: Aug. 2, 2005

(54) METHOD OF MANUFACTURING SEMICONDUCTOR DEVICE

(75) Inventors: Toru Yoshie, Tokyo (JP); Kazuhide Abe, Tokyo (JP); Yusuke Harada, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 169 days.

(21) Appl. No.: 10/103,696

(22) Filed: Mar. 25, 2002

(65) Prior Publication Data

US 2003/0045087 A1 Mar. 6, 2003

(30) Foreign Application Priority Data

Aug. 31, 2001 (JP) .......................... 2001-263435

(51) Int. Cl.⁷ .................. H01L 21/82; H01L 21/326; H01L 21/302; H01L 21/26
(52) U.S. Cl. .................. 438/132; 438/130; 438/131; 438/467; 438/720; 438/798; 438/799; 438/601
(58) Field of Search .............................. 438/130, 131, 438/132, 759, 798, 789, 765, 707, 719, 720

(56) References Cited

U.S. PATENT DOCUMENTS

| | | | | |
|---|---|---|---|---|
| 5,449,640 A | * | 9/1995 | Hunt et al. | 438/640 |
| 5,949,323 A | * | 9/1999 | Huggins et al. | 337/401 |
| 6,998,299 | | 12/1999 | Krishnan | |
| 6,433,403 B1 | * | 8/2002 | Wilford | 257/529 |
| 2001/0039113 A1 | * | 11/2001 | Blalock et al. | 438/629 |

FOREIGN PATENT DOCUMENTS

| | | |
|---|---|---|
| JP | 05-251693 | 9/1993 |
| JP | 09-069607 | 3/1997 |
| JP | 09-321279 | 12/1997 |
| JP | 10-189501 | 7/1998 |
| JP | 11-163134 | 6/1999 |

OTHER PUBLICATIONS

Van Zant, Peter; Microchip Fabrication (2000); McGraw–Hill, Fourth Edition, pp. 37, 154 and 403.*
Merriam Webster's Collegiate Dictionary (2001), Merriam Webster Inc.; Tenth Edition, p. 969.*

* cited by examiner

*Primary Examiner*—Erik J. Kielin
*Assistant Examiner*—David L. Hogans
(74) *Attorney, Agent, or Firm*—Volentine Francos, PLLC (57) ABSTRACT

A conductive layer which is formed on an insulative layer on a semiconductor substrate is connected to the semiconductor substrate via a through portion which passes through the insulative layer and reaches the semiconductor substrate. In a state where the conductive layer is electrically connected to the semiconductor substrate via the through portion, a patterning process using a plasma etching is performed on the conductive layer, thereby forming a conductive path. After the formation of the conductive path, a heating process is performed on the substrate or the conductive path in order to disconnect the electrical connection between the through portion and the substrate by a reaction between the through portion and the semiconductor substrate which is in contact therewith.

29 Claims, 4 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device such as a semiconductor integrated circuit and, more particularly, to a method of manufacturing a semiconductor device using a plasma etching for the purpose of patterning a metal layer so as to form a conductive wiring by the metal layer which covers over an insulative layer formed on a semiconductor substrate.

2. Related Background Art

Hitherto, in a manufacturing step of a semiconductor device, there is a case where a conductive wiring is formed by a conductive layer laminated on a semiconductor substrate through an insulative layer. In the case where an etching process for forming the conductive wiring is performed by using, for example, a high density plasma, an electric potential difference due to charge-up is caused between the conductive layer which is subjected to a plasma gas and the semiconductor substrate arranged through the insulative layer under the conductive layer. Therefore, in the case where a gate electrode of a semiconductor device such as an MOS transistor has been formed under the conductive layer, if the excessive potential difference is caused, there is a case where a thin gate oxide film under the gate electrode is damaged.

As a conventional technique for preventing such a damage caused by the charge-up, for example, there is a technique disclosed in JP-A-10-189501.

According to the conventional technique, a conductive layer and a semiconductor substrate are electrically connected through a predetermined conductive path serving as a fuse mechanism. For the fuse mechanism, a plurality of shallow grooves are formed on the conductive layer, that is, in a contact portion of the conductive layer and the semiconductor substrate at intervals of about the minimum working dimensions which are specified by a design rule.

According to the fuse mechanism, the conductive layer and the substrate are electrically connected through bottom portions of the shallow grooves of the conductive layer, that is, fuse portions. At the time of an etching process for the conductive wirings, the bottom portions of the shallow grooves of the conductive layer, that is, fuse portions are also subjected to the etching process. In the fuse portions, however, the etching operation progresses relatively slowly due to a conventionally well-known loading effect. For such a period of time, since the electrical connection between the conductive layer and the substrate is maintained, electric potentials of both of them are almost equal, so that the charge-up damage is prevented.

According to the fuse mechanism, after completion of the conductive wirings by the conductive layer, the fuse portions are separated due to the progress of the etching function, so that the electrical connection between the conductive layer and the substrate is disconnected.

According to the fuse mechanism of the conventional technique, however, in order to certainly maintain the electrical connection until the conductive wirings are completed, it is necessary to design the fuse portions including the shallow grooves of a small width which provide such characteristics as mentioned above. However, it is not easy to design such a fuse mechanism.

It is also necessary to hold a pattern region of the fuse mechanism and, since an effective area adapted to form the conductive wirings of the conductive layer is narrowed for such a purpose, it is disadvantageous when designing the pattern of the conductive wirings.

OBJECTS AND SUMMARY OF THE INVENTION

It is, therefore, an object of the invention to provide a method of manufacturing a semiconductor device which can relatively easily form a mechanism for preventing the charge-up damage.

The present invention is made in consideration of a fundamental concept such that when conductive wirings are formed in a manufacturing step of a semiconductor device, in order to prevent the charge-up damage, an electric connection between a connecting portion for electrically connecting a conductive layer and a semiconductor substrate in order to almost equalize electric potentials of both of them and the semiconductor substrate which is in contact with the connecting portion is disconnected by using a predetermined reaction between them which is induced by a heating process.

According to the invention, there is provided a method of manufacturing a semiconductor device having a conductive path which is formed on an insulative layer which covers over a semiconductor element on a semiconductor substrate, the method comprising:

forming a conductive layer forming a conductive layer on the insulative layer, the conductive layer having a through portion which extends to the semiconductor substrate through the insulative layer at a portion corresponding to the conductive path, the conductive layer being electrically connected to the semiconductor substrate via the through portion;

forming the conductive path by performing a patterning process using a plasma etching to the conductive layer in a state where the conductive layer is electrically connected to the semiconductor substrate via the through portion; and after the conductive path is formed, performing a heating process to the substrate or the conductive path in order to disconnect an electrical connection between the through portion and the semiconductor substrate by a reaction between the through portion and the semiconductor substrate.

According to the manufacturing method of the invention, at the time of the patterning process by the plasma etching, since the through portion of the conductive layer is come into contact with the substrate portion, the conductive layer and the substrate are electrically connected via the through portion, thereby enabling an electric potential of the conductive layer to almost coincide with that of the substrate. Consequently, the occurrence of an excessive potential difference between the conductive layer and the substrate due to the charge-up can be prevented.

According to the manufacturing method, for example, since the reaction between the through portion and the substrate portion which is induced by the heating process is used for disconnecting the conductive layer from the substrate, by controlling timing for performing the heating process, the electrical connection can be certainly maintained for a period of time during which the conductive path is formed. That is, the connection is maintained unless the heating process is executed.

Since the through portion for suppressing the electric potential is formed under the conductive layer portion corresponding to the conductive path, the through portion does not exercise an influence on a pattern arrangement of the conductive path. Further, the through portion can be relatively easily formed without needing fine work for realizing the minimum working dimensions.

For example, silicon crystal can be used as a semiconductor substrate. For example, silicon dioxide can be used as an insulative layer. A metal material which permits a diffusion of silicon due to the heating is used as a conductive material of the conductive layer. For example, tungsten can be used as a metal material.

According to the reaction between the through portion and the substrate is, for example, diffusion of silicon in the silicon crystal into the metal material. If a cavity which shuts off a mechanical, that is, physical connection between the substrate and the through portion is caused in the substrate due to the diffusion of silicon from the silicon crystal into the metal material, the electrical connection between the through portion and the substrate is disconnected.

Impurities for promoting the diffusion reaction can be preliminarily added into a part of the substrate which is in contact with the through portion. For example, phosphorus can be used as impurities. At this time, it is desirable to introduce phosphorus into the part of the substrate by an ion implantation method.

For example, the heating process can be performed under a high temperature argon gas atmosphere and, at this time, it is desirable to set a temperature of the argon gas atmosphere to 700° C. and set a processing time by the heating to about 30 minutes.

The semiconductor element on the substrate is a gate element having a gate electrode and a gate insulative film under the electrode and, upon formation of the conductive layer, a connecting portion which reaches the gate electrode via the insulative layer can be formed in the portion in the conductive layer corresponding to the conductive path.

Upon formation of the conductive layer, after the insulative layer is formed, in order to form a through-hole for the through portion, an etching process for removing the insulative layer portion corresponding to the through-hole can be performed. Prior to forming the conductive layer, for example, impurities for promoting the reaction between the substrate portion and the through portion can be added into the substrate portion exposed via the through-hole formed by the etching process.

After that, the conductive layer having the through portion which fills up the through-hole can be formed on the insulative layer.

Prior to forming the conductive layer onto the insulative layer, the through-hole for the through portion can be formed. Prior to forming the conductive layer, for example, impurities for promoting the reaction between the substrate and the through portion can be added into the part of the substrate exposed via the through-hole. After that, an auxiliary layer for raising a coupling force between the conductive layer and the insulative layer can be formed on the insulative layer and along the inner wall of the through-hole. The conductive layer having the through portion which fills up the through-hole can be formed on the auxiliary layer.

Prior to forming the conductive layer, for example, the portion on the bottom portion of the inner wall of the through-hole in the auxiliary layer is removed by the etching process lest it obstructs the reaction between the through portion and the substrate due to the heating.

The above and other objects and features of the present invention will become apparent from the following detailed description and the appended claims with reference to the accompanying drawings.

DETAILED DESCRIPTION OF THE PREFERRED EMBODIMENTS

Embodiments of the present invention will now be described hereinbelow with reference to the drawings.

<First Embodiment>

Figure 1A:
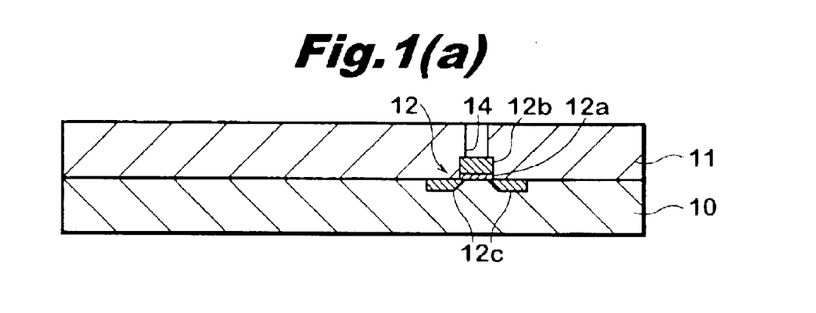
FIGS. 1(a) to 1(f) are processing step diagrams for explaining the first embodiment of a manufacturing method according to the present invention.

According to the first embodiment of a manufacturing method of a semiconductor device according to the present invention, as shown in FIG. 1(a), a conventionally well-known gate element 12 is buried under an insulative layer 11 which covers over a semiconductor substrate 10 made of silicon crystal and is made of silicon dioxide. The gate element 12 has: a gate electrode 12b formed over the semiconductor substrate 10 through a gate insulative film 12a; and source/drain regions 12c formed on both sides of the gate electrode 12b.

As will be explained hereinlater, a conductive layer 13 (refer to FIG. 1(d)) made of tungsten for a conductive wiring 13' (refer to FIG. 1(e)) which is electrically connected to the gate electrode 12b is formed over the insulative layer 11.

Prior to forming the conductive layer 13, the insulative layer 11 on the gate electrode 12b is partially removed via a conventionally well-known photolithography step and an etching processing step subsequent thereto. Thus, a connecting hole 14 for connecting the gate electrode 12b and the conductive layer 13 is formed.

When tungsten as a material of the conductive layer 13 is formed on the insulative layer 11 including the connecting hole 14, on the bottom portion of the connecting hole 14, if tungsten is directly come into contact with the upper surface portion of the gate electrode 12b, as conventionally well-known, there is a fear such that the contact surface of both of them deteriorates due to a chemical reaction between tungsten and the material of the gate electrode 12b. As conventionally well-known, tungsten of the conductive layer 13 is hard to be formed on the insulative layer 11 made of silicon dioxide because of its characteristics.

Figure 1B:
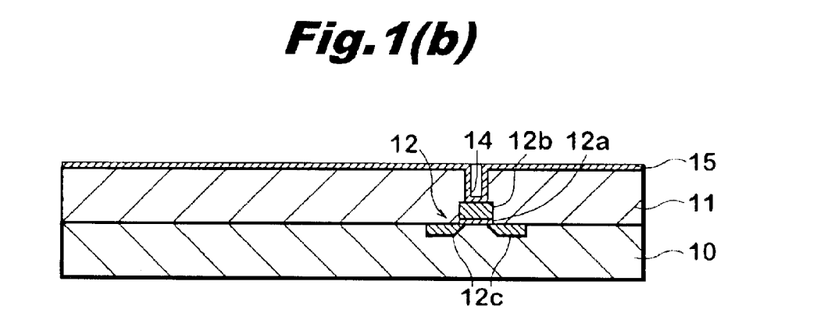

To prevent such inconveniences, therefore, as shown in FIG. 1(b), an auxiliary layer 15 is formed on the inner wall surface of the connecting hole 14 and along the upper surface of the insulative layer 11.

The auxiliary layer 15 can use, for example, a conventionally well-known laminate structure constructed by a titanium (Ti) film and a titanium nitride (TiN) in order to prevent the chemical reaction between the gate electrode 12b and tungsten (13) and enable tungsten (13) to be easily formed onto the insulative layer 11.

The laminate structure of the auxiliary layer 15 can be formed by using, for example, a conventionally well-known sputtering method. That is, a titanium film of a thickness of 50 nm is grown onto the insulative layer 11 in an argon gas atmosphere at a DC power of 9 kW and a film forming pressure of 0.13 Pa, and thereafter, a titanium nitride film of a thickness of 30 nm is grown onto the titanium film in a nitrogen atmosphere at a DC power of 8 kW and a film forming pressure of 0.55 Pa, so that the laminate structure can be formed.

According to the manufacturing method of the present invention, the conductive layer 13 is formed on the auxiliary layer 15 after the auxiliary layer is formed. However, as will be explained hereinlater, simultaneously with the formation of the conductive layer 13, a through portion 13a (refer to FIG. 1(d)) for mutually connecting the conductive layer 13 and the substrate 10 is formed.

Figure 1C:
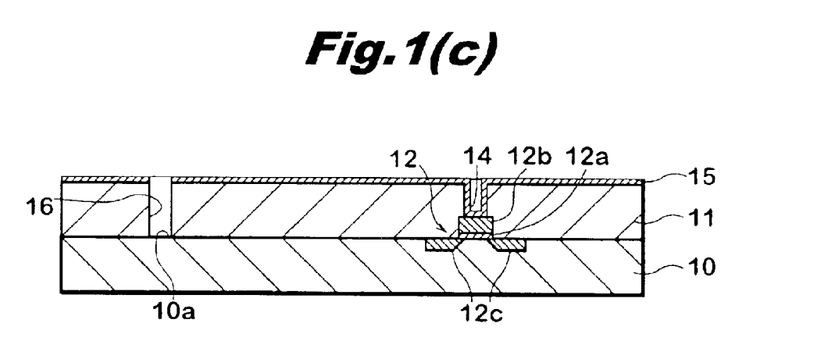

Prior to forming the through portion 13a, in the first embodiment, after the auxiliary layer 15 is formed, as shown in FIG. 1(c), a through-hole 16 which reaches the substrate 10 through the auxiliary layer and insulative layer 11 is formed. By the conventionally well-known photolithography and etching process, the through-hole 16 can be formed in a pattern region of the conductive wiring 13', that is, at a desired position where a device such as a gate element 12 does not exist.

After the through-hole 16 is formed, a material for the conductive layer 13 which fills up the through-hole and covers over the insulative layer 11 is deposited as will be explained hereinlater. Prior to depositing such a material, tungsten constructing the conductive layer and predetermined impurities for promoting the reaction with silicon serving as a substrate are added by heating into a substrate portion 10a exposed by the formation of the through-hole 16. In the embodiment, phosphorus ions ($P^+$) are used as impurities.

The addition of the impurities can be performed by the conventionally well-known ion implantation method. The ion implantation can be performed, for example, at an accelerating voltage of 20 keV and an ion concentration of $2 \times 10^{15}$ cm$^{-2}$. After that, a conventionally well-known annealing treatment by a heating process of, for example, 10 minutes in a nitrogen atmosphere at 900° C. is performed.

Figure 1D:
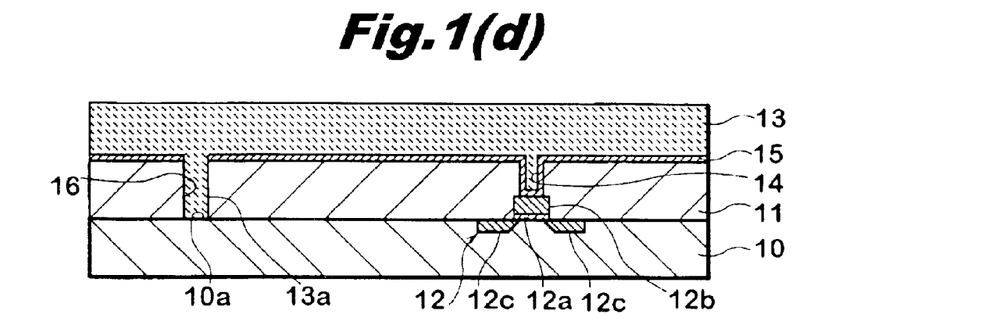

After the impurities are added, as shown in FIG. 1(d), in order to form the conductive layer 13, tungsten serving as a material of the conductive layer 13 is deposited in the through-hole 16 and onto the auxiliary layer 15 including the region in the connecting hole 14 by using, for example, the conventionally well-known CVD method (Chemical Vapor Deposition).

In the CVD step, for example, the tungsten film 13 of a thickness of 300 nm can be deposited onto the auxiliary layer 15 at a temperature of 430° C. Thus, the through portion 13a which fills up the through-hole 16 is formed simultaneously with the formation of the conductive layer 13 for the conductive wiring, and the conductive layer 13 and substrate 10 are connected via the through portion 13a.

Figure 1E:
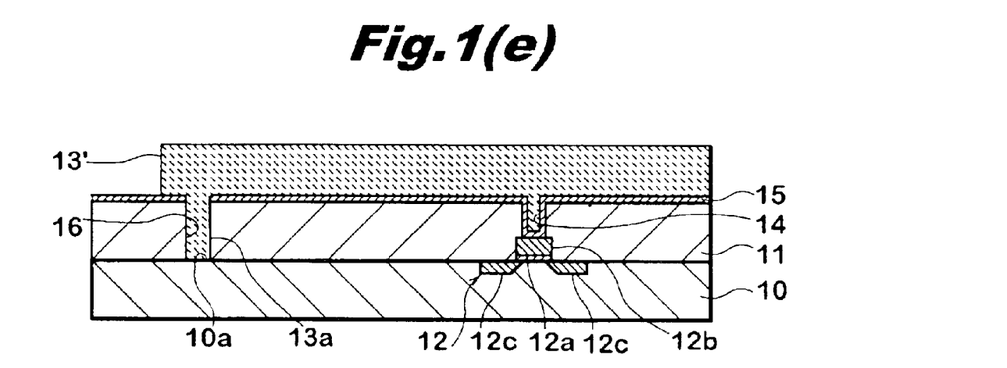

After that, in order to form the conductive wiring 13' in the conductive layer 13, as shown in FIG. 1(e), an etching process by a high density plasma for removing unnecessary portions of the conductive layer 13 is executed.

According to the plasma etching process, since the conductive layer 13 is electrically connected to the substrate 10 via the through portion 13a of the conductive layer as mentioned above, the conductive layer 13 and substrate 10 are held at an almost equal electric potential.

After that, by removing all of the unnecessary portions of the conductive layer 13, the patterning of the conductive wiring 13' is completed. However, since the through portion 13a is formed in a lower portion of the conductive wiring 13' as mentioned above, even upon completion of the patterning, the electrical connection between the conductive wiring 13' as a remaining portion of the conductive layer 13 and the substrate 10 is certainly maintained.

In the gate element 12, consequently, during the plasma etching process, the occurrence of a large potential difference due to the excessive charge-up is prevented between the gate electrode 12b and the substrate 10. The gate insulative film 12a under the gate electrode 12b is protected against the charge-up damage.

According to the manufacturing method, after completion of the plasma etching process, the heating process is performed in order to disconnect the electrical connection between the conductive layer 13 and the substrate 10.

In more detail, after the plasma etching process, the heating process of, for example, 30 minutes in an argon gas atmosphere at 700° C. is performed to the substrate 10 on/over which the conductive wiring 13' has been formed. By the heating process, silicon of the substrate 10 is diffused into the through portion 13a made of tungsten, tungsten is changed to silicide, and a cavity is formed in the substrate portion 10a.

Figure 1F:
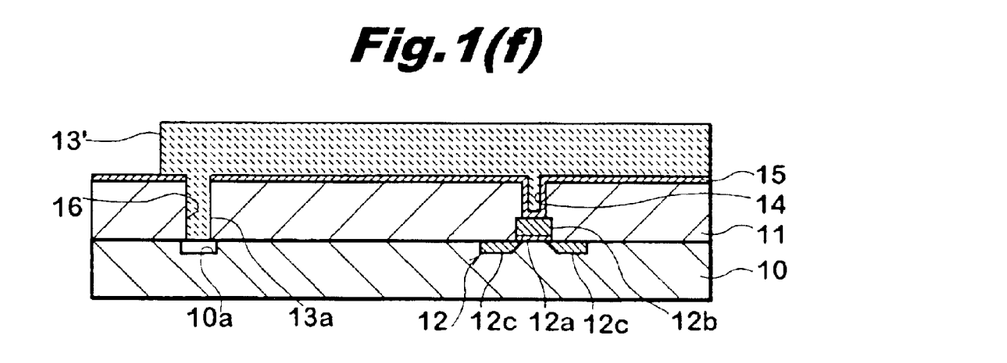

In the substrate portion 10a, the cavity further grows in association with the progress of the diffusion reaction. After that, when the cavity enlarges in excess of the region of the through-hole 16 as shown in FIG. 1(f), all of the contact portions of the through portion 13a and the substrate portion 10a are shut off, so that the electrical connection between the conductive layer 13 and the substrate 10 is disconnected.

With respect to the diffusion reaction, since phosphorus as impurities has previously been added into the substrate portion 10a which is in contact with the through portion 13a of the substrate 10, the diffusion of silicon is promoted in the substrate portion 10a and the electrical connection between the conductive layer 13 and the substrate 10 can be disconnected by the heating process of a relatively short time as mentioned above.

Thus, since the conductive wiring 13' enters a state where it is insulated from the semiconductor substrate 10, in the semiconductor device, it can be used as a conductive path for electrically connecting the elements such as a gate element 12 and the like.

In the first embodiment, since the through portion 13a which reaches the surface on the substrate 10 from the portion under the conductive layer is formed in the portion of the conductive layer 13 corresponding to the conductive wiring 13', the substrate 10 and the conductive layer 13 are electrically connected during the plasma etching process for forming the conductive wiring 13'. Further, after the conductive wiring 13' is completed, a cavity adapted to shut off all of the contact portions is formed in the substrate portion 10a which is in contact with the through portion 13a by the diffusion reaction which is induced by the heating process, so that the electrical connection is disconnected.

According to the embodiment, therefore, since the electric potentials of both of the substrate 10 and the conductive layer 13 are maintained at an almost equal potential by the electrical connection between the substrate 10 and the conductive layer 13, the charge-up damage can be avoided during the plasma etching process. The through portion 13a serving as a mechanism for preventing the damage can be formed by filling up a conductive material into the through-hole 16 which has previously been formed in the insulative layer 11 without needing a complicated shape, so that it can be relatively easily formed. Since the through portion 13a is formed in the lower portion of the conductive wiring 13', it does not exercise an influence on the pattern arrangement of the conductive wiring 13' in terms of the design.

Further, according to the embodiment, since the diffusion reaction which is induced by the heating process is used for disconnecting the electrical connection, disconnecting timing can be arbitrarily controlled. Consequently, by performing the heating process after the conductive wiring 13' is completed, the electrical connection can be certainly maintained during the plasma etching process.

<Second Embodiment>

Figure 2A:
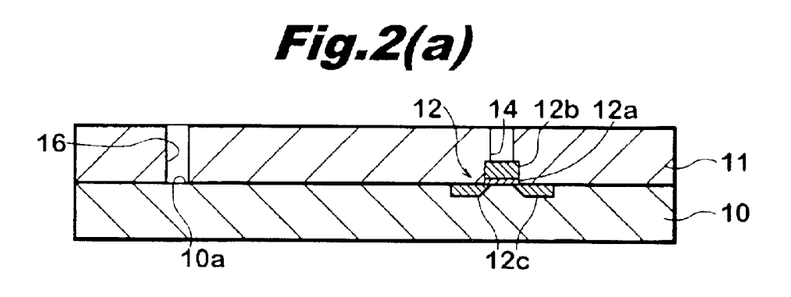
FIGS. 2(a) to 2(f) are processing step diagrams for explaining the second embodiment of a manufacturing method according to the present invention.

In the second embodiment of the manufacturing method according to the present invention, the through-hole 16 for the through portion 13a described in the first embodiment is formed simultaneously with the connecting hole 14 on the gate electrode 12b. That is, as shown in FIG. 2(a), in order to form the connecting hole 14 and the through-hole 16 by the photolithography and etching process similar to those in the first embodiment, the insulative layer 11 on the gate electrode 12b and on the substrate portion 10a is partially removed.

After the connecting hole 14 and the through-hole 16 are formed, phosphorus as impurities for promoting the process for converting into silicide is added by the ion implantation method into the substrate portion 10a exposed by the formation of the through-hole 16 in a manner similar to the first embodiment, and the annealing treatment is further executed to them.

Figure 2B:
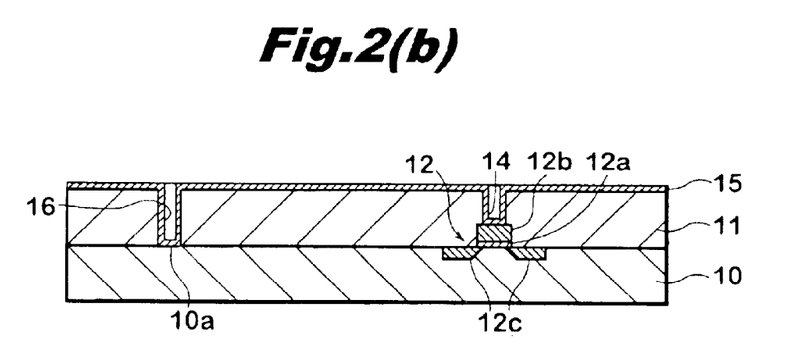

After that, as shown in FIG. 2(b), the auxiliary layer 15 having a laminate structure similar to that described in the first embodiment is formed on the insulative layer 11 and along the inner walls of the connecting hole 14 and through-hole 16.

Figure 2C:
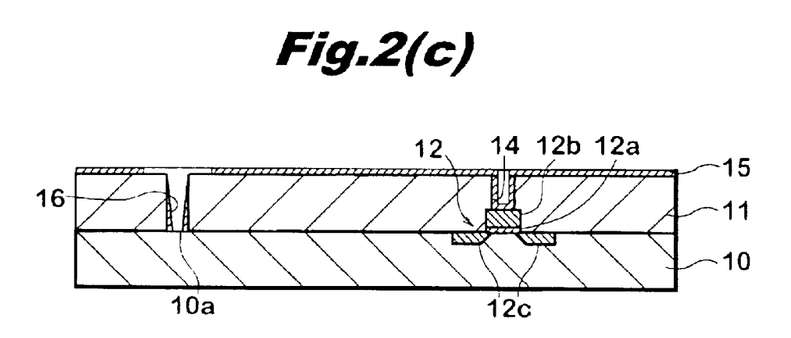

Although the conductive layer 13 is formed on the auxiliary layer 15 after the formation of the auxiliary layer 15, in the second embodiment, prior to forming the conductive layer 13, as shown in FIG. 2(c), a bottom portion in the through-hole 16 of the auxiliary layer is removed by the conventionally well-known etching process. Thus, in a state where the auxiliary layer 15 remains along the peripheral wall of the through-hole 16 formed in the insulative layer 11, the semiconductor substrate 10 is exposed in the substrate portion 10a corresponding to one end of the through-hole 16.

Figure 2D:
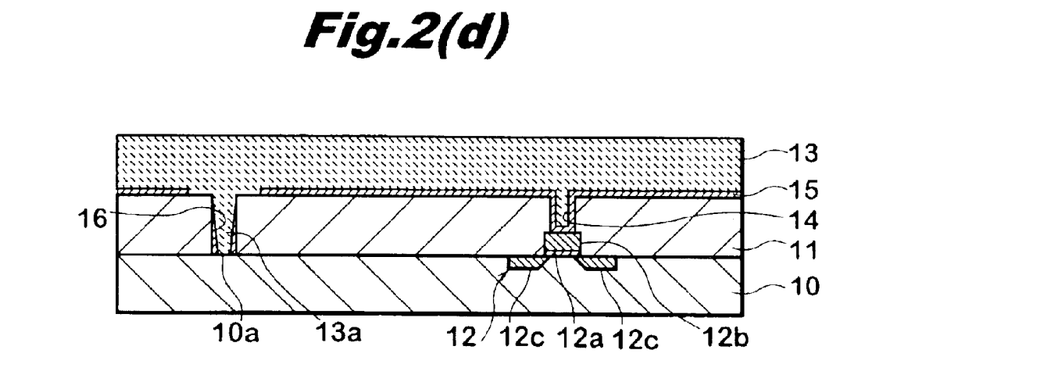

After completion of the etching process, as shown in FIG. 2(d), the conductive layer 13 which fills up the inside of the connecting hole 14 and the inside of the through-hole 16 and covers over the auxiliary layer 15 is formed. In this instance, since the bottom portion existing in the through-hole 16 of the auxiliary layer 15 has previously been removed as mentioned above, the through portion 13a which reaches the substrate portion 10a from the lower portion of the conductive layer 13 and is electrically connected to the substrate portion 10a is formed.

With respect to the formation of the through portion 13a, in the second embodiment, as mentioned above, since the auxiliary layer 15 is formed along the side wall portion of the through-hole 16 in the insulative layer 11 made of silicon dioxide, a coupling force between the side wall portion and the through portion 13a made of tungsten is enhanced.

Figure 2E:
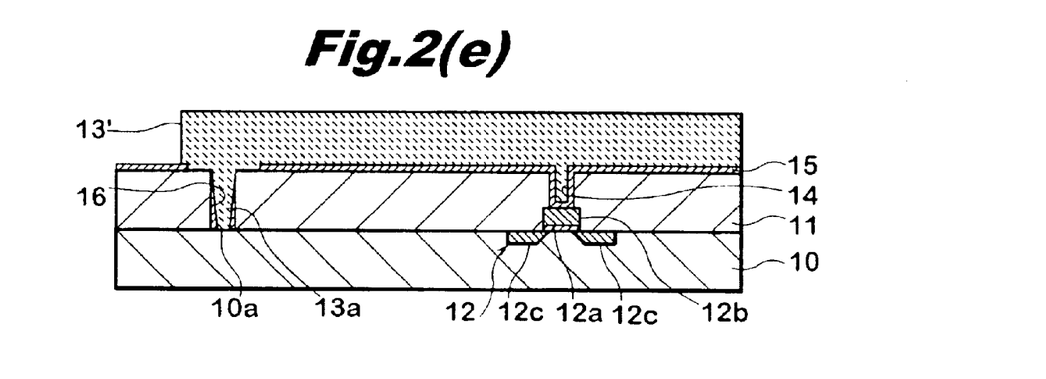
Figure 2F:
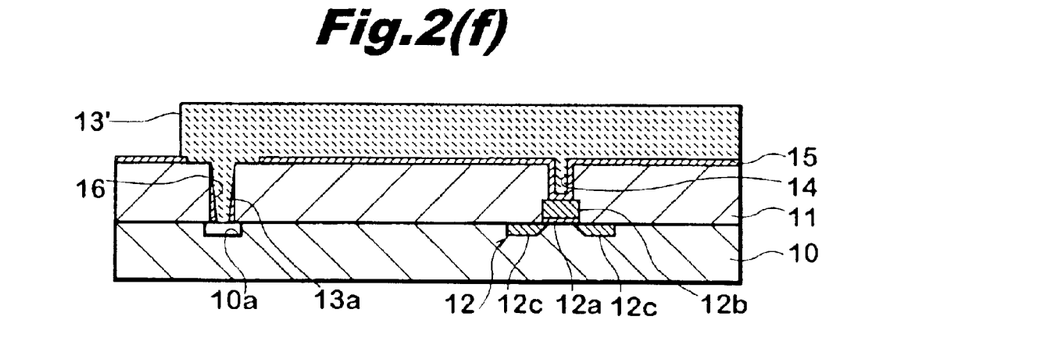

After the conductive layer 13 is formed, an etching process by the high density plasma similar to that in the first embodiment is performed in order to form the conductive wiring 13' of the conductive layer 13, as shown in FIG. 2(e). After completion of the conductive wiring 13' by the etching process, the heating process described in the first embodiment is performed in order to form the cavity in the substrate portion 10a, as shown in FIG. 2(f).

In the second embodiment, as mentioned above, prior to forming the auxiliary layer 15 onto the insulative layer 11, the through-hole 16 is formed in the insulative layer 11 simultaneously with the connecting hole 14. After that, in the through-hole 16, when the conductive layer 13 is formed, the through portion 13a is formed after the formation of the auxiliary layer 15 onto the inner wall portion of the through-hole 16.

According to the embodiment, therefore, an effect similar to that in the first embodiment is obtained. Since the auxiliary layer 15 exists between the through-hole 16 and the through portion 13a, a coupling force between them is enhanced. An unexpected accident such as a short-circuit due to a peeled-off broken piece of the through portion 13a can be certainly prevented.

Although each of the embodiments has been described above with respect to the example of using tungsten as a material of the conductive layer 13, titanium, aluminum, cobalt, or copper can be also arbitrarily used as a material of the conductive layer in place of tungsten. The material of the auxiliary layer 15 can be also properly changed in accordance with the material of the conductive layer 13.

According to the manufacturing method of the present invention, when the conductive path is formed by the plasma etching, since the conductive layer is electrically connected to the semiconductor substrate via the through portion of the conductive layer, the electric potential of the conductive layer and that of the substrate can be made almost coincident. Thus, the occurrence of the excessive potential difference between the conductive layer and the substrate due to the charge-up can be prevented.

According to the manufacturing method, since the reaction between the through portion and the substrate portion which is induced by the heating process is used for disconnecting the electrical connection, by controlling the timing for the heating process, the electrical connection can be certainly maintained during the formation of the conductive path by a relatively simple construction.

The present invention is not limited to the foregoing embodiments but many modifications and variations are possible within the spirit and scope of the appended claims of the invention.

What is claimed is:

1. A method of manufacturing a semiconductor device having a conductive path which is formed on an insulative layer which covers over a semiconductor element on a semiconductor substrate, the method comprising:

forming a conductive layer on said insulative layer, said conductive layer having a through portion which extends to said semiconductor substrate through said insulative layer at a portion corresponding to said conductive path, said conductive layer being electrically connected to said semiconductor substrate via said through portion;

forming said conductive path by performing a patterning process on said conductive layer using a plasma etching in a state where said conductive layer is electrically connected to said semiconductor substrate via said through portion; and after said conductive path is formed, performing a heating process on said semiconductor substrate or said conductive path in order to disconnect an electrical connection between said through portion and said semiconductor substrate by a reaction between said through portion and said semiconductor substrate, wherein said semiconductor substrate is made of silicon crystal, said insulative layer is made of silicon dioxide, and a conductive material of said conductive layer is made of a metal material which permits a diffusion of silicon by heating, and wherein said reaction between said through portion and said semiconductor substrate is diffusion of silicon from said silicon crystal into said metal material, and said electrical connection of said through portion and said semiconductor substrate is completely disconnected by a cavity which is formed in said semiconductor substrate by said diffusion.

2. A method according to claim 1, wherein the conductive material for said conductive layer is tungsten.

3. A method according to claim 1, wherein a part of said semiconductor substrate that is in contact with said through portion has impurities added thereto for promoting said reaction by said diffusion.

4. A method according to claim 3, wherein said impurities are phosphorus and are introduced into said semiconductor substrate by an ion implantation method.

5. A method according to claim 4, wherein said heating process is performed under a high temperature argon gas atmosphere.

6. A method according to claim 5, wherein a temperature of said high temperature argon gas atmosphere is equal to 700° C. and a processing time of said heating process is equal to about 30 minutes.

7. A method according to claim 1, wherein said semiconductor element on said semiconductor substrate is a gate element having a gate electrode and a gate insulative film under said gate electrode, and upon formation of said conductive layer, a connecting portion which passes through said insulative layer and reaches said gate electrode is formed at a portion of said conductive layer corresponding to said conductive path.

8. A method according to claim 1, wherein after said insulative layer is formed, in order to form a through-hole for said through portion, an etching process for removing a portion of said insulative layer corresponding to said through-hole is performed and thereafter said conductive layer which fills up said through-hole is formed on said insulative layer.

9. A method according to claim 8, wherein prior to forming said conductive layer, impurities for promoting said reaction between said through portion and said semiconductor substrate are added into said semiconductor substrate exposed via said through-hole formed by said etching process.

10. A method of manufacturing a semiconductor device having a conductive path which is formed on an insulative layer which covers over a semiconductor element on a semiconductor substrate, the method comprising:

forming a conductive layer on said insulative layer, said conductive layer having a through portion which extends to said semiconductor substrate through said insulative layer at a portion corresponding to said conductive path, said conductive layer being electrically connected to said semiconductor substrate via said through portion;

forming said conductive path by performing a patterning process on said conductive layer using a plasma etching in a state where said conductive layer is electrically connected to said semiconductor substrate via said through portion; and after said conductive path is formed, performing a heating process on said semiconductor substrate or said conductive path in order to disconnect an electrical connection between said through portion and said semiconductor substrate by a reaction between said through portion and said semiconductor substrate, wherein prior to forming said conductive layer on said insulative layer, a through-hole for said through portion is formed and an auxiliary layer is formed on a bottom of said through-hole, on said insulative layer, and along an inner wall of said through-hole, and wherein prior to forming said conductive layer, a portion of said auxiliary layer on the bottom of said through-hole is removed by an etching process, and thereafter said conductive layer which fills up said through-hole is formed on said auxiliary layer.

11. A method according to claim 10, wherein prior to forming said conductive layer, impurities for promoting said reaction between said through portion and said semiconductor substrate are added into said semiconductor substrate exposed via said through-hole formed by said etching process.

12. A method according to claim 1, further comprising:

forming a contact hole through said insulative layer to expose said semiconductor element; and forming an auxiliary layer on said insulative layer and in said contact hole, before said forming a conductive layer.

13. A method according to claim 12, wherein said through portion extends in a through-hole formed in said insulative layer, the through-hole being formed after said forming an auxiliary layer.

14. A method according to claim 12, wherein said through portion extends in a through-hole formed in said insulative layer, said through-hole and said contact hole are formed in said insulative layer simultaneously, and said auxiliary layer is also formed in said through-hole.

15. A method of fabricating a semiconductor device comprising:

forming an insulative layer on a semiconductor substrate;

forming a conductive layer on the insulative layer, the conductive layer extending through the insulative layer to be electrically connected to the semiconductor substrate;

patterning the conductive layer by plasma etching; and heating the semiconductor substrate or the patterned conductive layer after said patterning, to form a cavity in the semiconductor substrate that completely disconnects the electrical connection between the patterned conductive layer and the semiconductor substrate.

16. A method according to claim 15, wherein the cavity is formed by heat induced diffusion of material from the semiconductor substrate into the patterned conductive layer.

17. A method according to claim 16, wherein the semiconductor substrate is made of silicon crystal, the insulative layer is made of silicon dioxide, and the conductive layer is made of a metal material which permits diffusion of silicon by heating.

18. A method according to claim 17, wherein the conductive layer is tungsten.

19. A method according to claim 18, wherein said heating is performed under a high temperature argon gas atmosphere.

20. A method according to claim 19, wherein a temperature of the high temperature argon gas atmosphere is equal to 700° C. and a processing time of said heating is equal to about 30 minutes.

21. A method according to claim 18, wherein a part of the semiconductor substrate that is in contact with the conductive layer prior to said heating has impurities added thereto for promoting diffusion.

22. A method according to claim 21, wherein the impurities are phosphorus and are introduced into the semiconductor substrate by an ion implantation method.

23. A method according to claim 10, wherein said semiconductor substrate is made of silicon crystal, said insulative layer is made of silicon dioxide, and a conductive material of said conductive layer is made of a metal material which permits diffusion of silicon by heating.

24. A method according to claim 23, wherein the conductive material for said conductive layer is tungsten.

25. A method according to claim 23, wherein said reaction between said through portion and said semiconductor substrate is diffusion of silicon from said silicon crystal into said metal material, and said electrical connection of said through portion and said semiconductor substrate is disconnected by a cavity which is formed in said semiconductor substrate by said diffusion.

26. A method according to claim 25, wherein a part of said semiconductor substrate that is in contact with said through portion has impurities added thereto for promoting said reaction by said diffusion.

27. A method according to claim 26, wherein said impurities are phosphorus and are introduced into said semiconductor substrate by an ion implantation method.

28. A method according to claim 27, wherein said heating process is performed under a high temperature argon gas atmosphere.

29. A method according to claim 28, wherein a temperature of said high temperature argon gas atmosphere is equal to 700° C. and a processing time of said heating process is equal to about 30 minutes.

* * * * *